United States Patent [19]

Ando

[11] Patent Number: 4,707,809

[45] Date of Patent: Nov. 17, 1987

[54] SEMICONDUCTOR MEMORY DEVICE WITH SHORTENED TIME PERIOD OF WORD LINE SELECTION

[75] Inventor: Manabu Ando, Tokyo, Japan

[73] Assignee: NEC Corporation, Tokyo, Japan

[21] Appl. No.: 754,103

[22] Filed: Jul. 12, 1985

[30] Foreign Application Priority Data

Jul. 12, 1984 [JP] Japan ................................ 59-144684

[51] Int. Cl.$^4$ .............................................. G11C 7/00
[52] U.S. Cl. .................................... 365/189; 365/233; 365/195
[58] Field of Search ............... 365/189, 230, 190, 233, 365/203, 194, 195

[56] References Cited

U.S. PATENT DOCUMENTS

| 3,942,162 | 3/1976 | Buchanan | 365/203 |
| 4,272,832 | 6/1981 | Ito | 365/233 |
| 4,405,996 | 9/1983 | Stewart | 365/227 |

FOREIGN PATENT DOCUMENTS 0221891 12/1984 Japan .................................. 365/230

OTHER PUBLICATIONS

Ochii et al. "An Ultralow Power 8K×8 Bit Full CMOS RAM with A Six-Transistor Cell", IEEE Journal of Solid State Circuits, vol. SC-17, No. 5, Oct. 1982, pp. 798-803.

Primary Examiner—James W. Moffitt
Assistant Examiner—Glenn A. Gossage
Attorney, Agent, or Firm—Sughrue, Mion, Zinn, Macpeak & Seas

[57] ABSTRACT

A semiconductor memory device in which the selected word line is energized only during a limited period of time is disclosed. The memory device is equipped with a clock generator which generates a one-shot pulse signal in response to a change in address signal or to an application of a write-enable signal, and the selected word line is energized by the one-shot clock signal. The clock generator further generates a one-shot clock signal in response to a change in an input data signal in a data-write operation. The input data is thereby sorted into the accessed memory cell, even when the data to be stored is supplied a relatively long time after the write-enable signal is applied.

11 Claims, 10 Drawing Figures

SEMICONDUCTOR MEMORY DEVICE WITH SHORTENED TIME PERIOD OF WORD LINE SELECTION

BACKGROUND OF THE INVENTION

The present invention relates to a semiconductor memory device, and more particularly to a random access memory device of a static type (called hereinafter as a "SRAM").

In a SRAM, each of memory cells is comprised of first and second IGFETs (insulated gate field effect transistors) and first and second loads. The first IGFET and first load are connected in series, and the second IGFET and second load are also connected in series. The connection point of the first IGFET and first load, i.e. a first node, and that of the second IGFET and second load, i.e. a second node, are connected to the gates of the second and first IGFETs, respectively. Each memory cell is disposed at each intersection of a plurality of word (row) lines and bit (column) lines. More specifically, first and second transfer gates are inserted between the first node and one of a pair of bit lines and between the second node and the other bit line, respectively, and these transfer gates are controlled by one word line. When the word line is selected in response to address signals, the first and second transfer gates are brought into an open state, so that the first and second nodes of each memory cell are electrically connected to a pair of the bit lines, respectively.

In a data-write operation wherein a write-enable signal and a data to be stored are supplied, a pair of bit lines are coupled to a data input circuit which in turn controls the relationship in potential between the bit lines in pair in response to the data to be stored. Either the first or second IGFET of the accessed memory cell is thereby turned on, and the conductive state of the first or second IGFET is maintained. On the other hand, in a data-read operation wherein the write-enable signal is not supplied, a pair of bit lines are coupled to a data output circuit. Since the potential difference is developed between the bit lines by the maintained conductive state of one of the first and second IGFET's and non-conductive state of the other IGFET in the accessed memory cell, the data output circuit detects the potential difference and produces an output data corresponding to the data stored in the accessed memory cell.

Thus, either one of the first and second IGFETs of each memory cell in the SRAM is always in the conductive state. For this reason, a d.c. current continues to flow into the first or second IGFET through one or the other of a pair of bit lines so long as the selected word line is energized. In addition, many memory cells are simultaneously accessed by the same word line. Accordingly, if the selected word line is energized during a whole period of each cycle of the data-write and data-read operations, a very large power current is dissipated.

One of the measures to reduce such power dissipation would be to shorten the energizing time of the selected word line during each cycle period of the data-write and data-read operations. For example, a clock generator may be provided to generate a one-shot pulse in response to the change in address signals and also generate it in response to the receipt of the write-enable signal, the generated one-shot pulse being used to energize the selected word line. Thus, the energizing time of the selected word line is shortened or limited to the time duration of the one-shot pulse and the d.c. current only flows during a limited period of time corresponding to the pulse width of the one-shot pulse.

This measure is not satisfactory, however, because the data to be written into the SRAM is often supplied to the SRAM after a relatively long period of time has elapsed from a point in time at which the write-enable signal is applied, that is, at the timing after the one-shot pulse disappears, such that the data would not be stored.

SUMMARY OF THE INVENTION

It is an object of the present invention to provide a semiconductor memory device equipped with an improved means for energizing the selected word line.

Another object of the present invention is to provide a random access memory device in which power dissipation is reduced without failing to write data.

It is still another object of the present invention to provide an improved random access memory device of a static type in which the selected word line is energized during a shortened period of time and failure in storing that data to be written is avoided.

A semiconductor memory device according to the present invention comprises a plurality of memory cells disposed at the intersections of word and bit lines, means responsive to a set of address signals for selecting at least one word line, means for receiving a write-enable signal, means for receiving a data signal, means responsive to the write-enable signal for generating a first one-shot signal, means responsive to change in the data signal for generating a second one-shot signal, means responsive to the first and second one-shot signals for energizing the selected word line, and means for writing the data signal into the memory cell or cells coupled to the selected and energized word line.

In the memory device according to the present invention, the generating means generates the one-shot signal not only when the write-enable signal is supplied but also when the data signal changes its logic level. Accordingly, when a pair of data signals to be stored is supplied to the memory device after the disappearance of the first one-shot signal, the second one-shot signal is generated in respone to the data signal to be stored. The selected word line is thereby energized again, so that the data is stored into the memory cell or cells accessed by the selected and energized word line.

BRIEF DESCRIPTION OF THE DRAWINGS

The above and other objects, advantages and features of the present invention will be more apparent from the following description taken in conjunction with the accompany drawings, in.

DETAILED DESCRIPTION OF THE PREFERRED EMBODIMENTS

Figure 1:
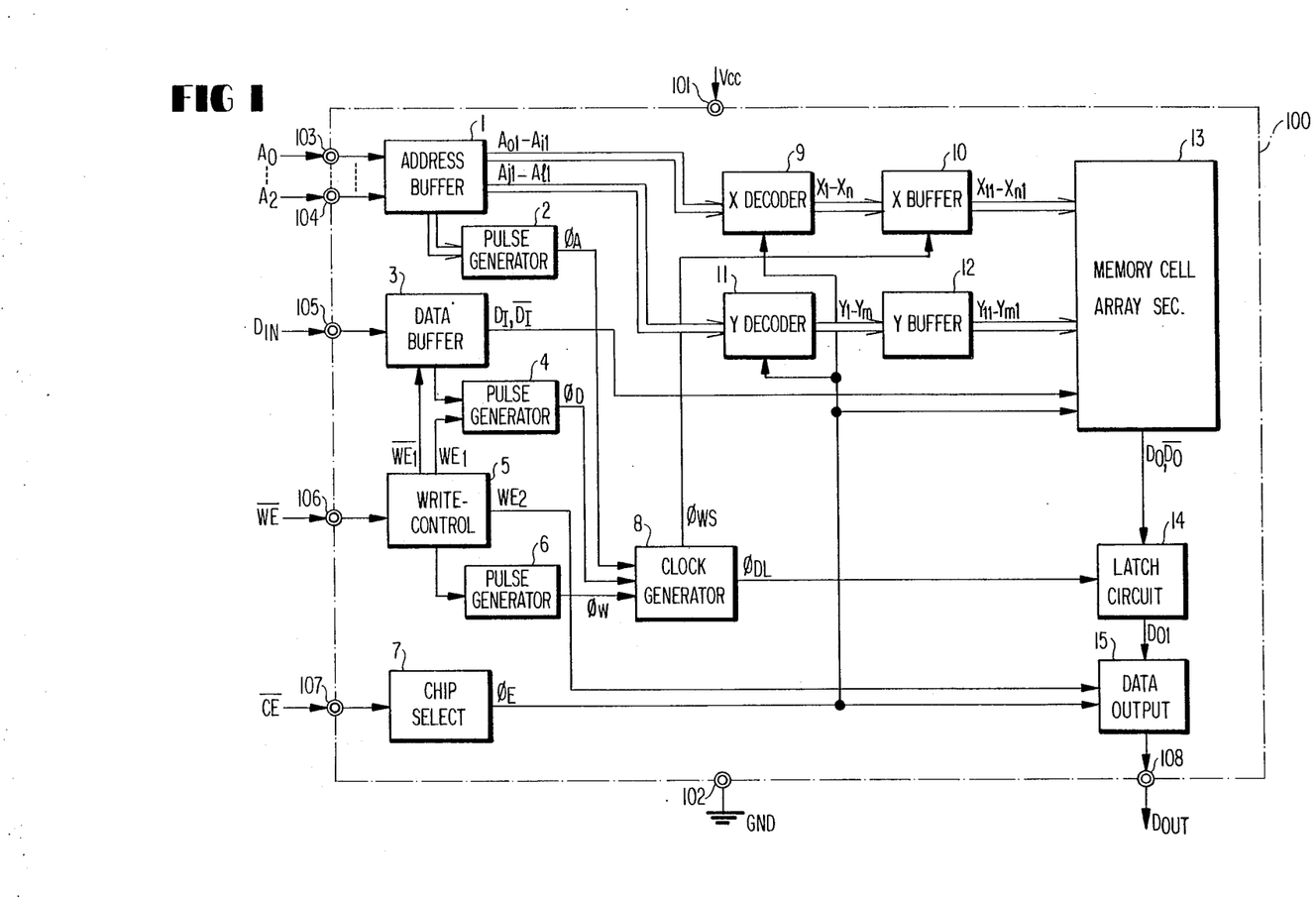
FIG. 1 is a block diagram showing a SRAM according to an embodiment of the present invention.

Referring to FIG. 1, a random access memory device of a static type (SRAM) according to an embodiment of the present invention is shown as an integrated circuit device 100 formed by CMOS (Complementary Metal Oxide Semiconductor) transistor technology. Address signals $A_0$ to $A_l$ are supplied to address input terminals 103 to 104 and further introduced to an address buffer 1. The address buffer 1 responds to the address signals $A_0$ to $A_l$ and produces non-inverted signals $A_{01}$ to $A_{l1}$ and inverted signals $\overline{A_{01}}$ to $\overline{A_{l1}}$. The address signals $A_0$ to $A_l$ are further supplied to a first pulse generator 2 which in turn generates a first pulse signal $\phi_A$ in response to a change in logic level of any one of the address signals $A_0$ to $A_l$.

Figure 3:
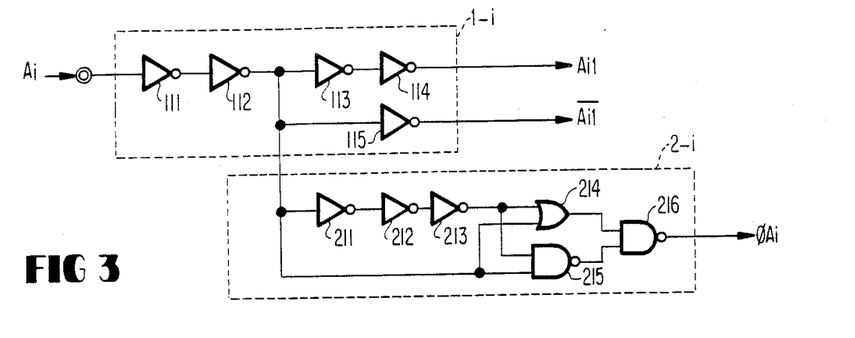
FIG. 3 is a logic circuit diagram of an address buffer and a first pulse generator shown in FIG. 1.

FIG. 3 is a logic circuit diagram of the address buffer 1 and the first pulse generator 2, but only one portion 1-i and 2-i thereof provided with respect to the address signal $A_i$ are shown in order to avoid cluttering up the drawing. The address signal $A_i$ is supplied to a series circuit comprised of four inverters 111 to 114 to obtain its non-inverted signal $A_{i1}$. An output of the inverter 112 is supplied to an inverter 115, and the inverted signal $\overline{A_{i1}}$ is thereby obtained. The output of the inverter 12 is further supplied directly to one input end of an OR circuit 214 and a NAND circuit 215 and through three inverters 211 to 213 to the other input end thereof. Outputs of the OR circuit 214 and the NAND circuit 215 are supplied to input ends of a NAND circuit 216, respectively. Accordingly, a pulse signal $\phi A_i$ is generated when the address signal $A_i$ changes its logic level from a low level to a high level and from the high level to the low level. The pulse width of the signal $\phi A_i$ corresponds to the sum of respective delay times of the inverters 211 or 213. The pulse signal $\phi A_i$ is supplied to an OR circuit (not shown) along with other pulse signals $\phi A_0$ to $\phi A_l$ which are generated in a similar manner to the signal $\phi Ai$. As a result, the first pulse generator 2 generates the pulse signal $\phi A$ in response to the change in logic level of any one of the address signals $A_0$ to $A_l$.

Turning back to FIG. 1, a data signal $D_{IN}$ to be stored is supplied to a data input terminal 105 and introduced into a data buffer 3. The data buffer 3 produces a non-inverted signal $D_I$ and an inverted signal $\overline{D_I}$ of the data signal $D_{IN}$. The data signal $D_{IN}$ is further supplied to a second pulse generator 4 which in turn generates a pulse signal $\phi_D$ in response to a change in logic level of the data signal $D_{IN}$. It should be noted that the data buffer 3 and the pulse generator 4 are activated by control signals $\overline{WE_1}$ and $WE_1$ produced from a write-control circuit which is described later.

Figure 4:
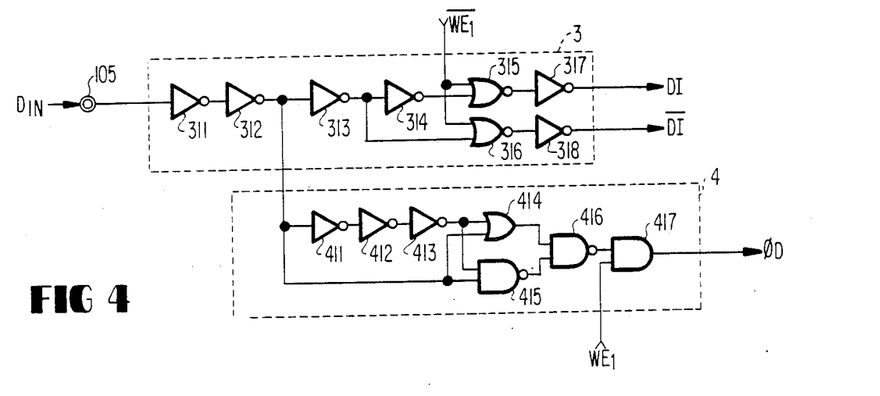
FIG. 4 is a logic circuit diagram showing a data buffer and a second pulse generator shown in FIG. 1.

The logic circuits of the data buffer 3 and the pulse generator 4 are shown in FIG. 4. The data signal $D_{IN}$ is supplied through four inverters 311 to 314 to one input end of a NOR circuit 315. An output of the inverter 313 is supplied to one input end of a NOR circuit 316. The other input ends of the NOR circuits 315 and 316 are supplied with the control signal $WE_1$, and the outputs thereof are supplied to inverters 317 and 318, respectively. The non-inverted and inverted signals $D_I$ and $\overline{D_I}$ of the data signal $D_{IN}$ are thereby obtained from the inverters 317 and 318 only when the control signal $\overline{WE_1}$ is in the low level, respectively. The output of the inverter 312 is supplied through three inverters 411 and 413 to one input end of an OR circuit 414 and a NAND circuit 415 and directly to the other input ends thereof. The outputs of the OR and NAND circuits 414 and 415 are supplied to an NAND circuit 416, the output end of which is in turn connected to one input end of an AND circuit 417. The other input end of the NAND circuit 417 is supplied with the control signal $WE_1$. Accordingly, the second pulse generator 4 is activated only when the control signal $WE_1$ takes the high level, and generates in the activated state the pulse signal $\phi_D$ when the data signal $D_{IN}$ changes its logic level both from the low level to the high level and from the high level to the low level. The pulse width of the signal $\phi_D$ corresponds to the sum of respective delay times of the inverters 411 and 413. If a plurality of data input terminals are employed. The data buffer 3 and the pulse generator 4 are provided by the same number.

As shown in FIG. 1, a write-enable signal $\overline{WE}$ is supplied through a write-enable terminal 106 to a write-control circuit 5 which controls whether the SRAM is brought into a data-write operation or a data-read operation. More specifically, as the logic circuit diagram of the write-control circuit 5 shows in FIG. 5, the write-enable signal $\overline{WE}$ is supplied to a series circuit comprised of four inverters 511 to 514 to obtain the internal control signal $\overline{WE_1}$, and the output of the inverter 574 is supplied to an inverter 515 to obtain the internal control signal $WE_1$. The output of the inverter 514 is further supplied to a series circuit comprised of three inverters 516 to 518, and a third internal control signal $WE_2$ is thereby produced. Accordingly, when the write-enable signal $\overline{WE}$ change to the low level, the signal $\overline{WE_1}$ changes to the low level and the signals $WE_1$ and $WE_2$ assume the high level. The data buffer 3 and the second pulse generator 4 are thereby activated, whereas a data output circuit 15 is inactivated. In other words, the SRAM 100 is brought into the data-write operation. On the other hand, the internal control signal $\overline{WE_1}$ changes to the high level and the signals $WE_1$ and $WE_2$ take the low level when the write-enable signal $\overline{WE}$ is at the high level. Accordingly, the data buffer 3 and the pulse generator 2 are inactivated, and the data output circuit 15 is activated. The SRAM 100 is thereby brought into the data-read operation.

Figure 5:
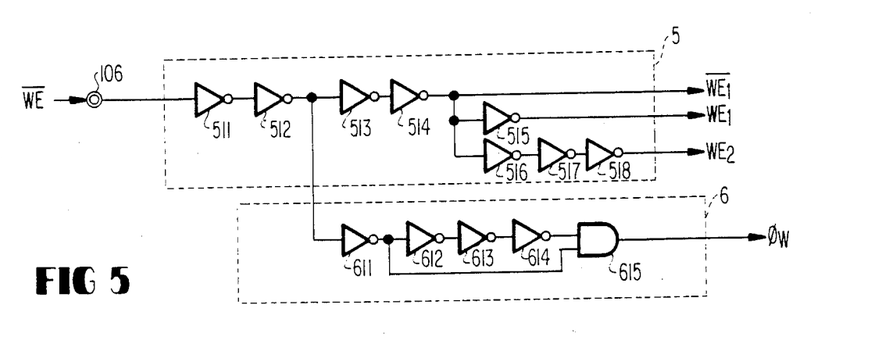
FIG. 5 is a logic circuit diagram representing a write-control circuit and a third pulse generator shown in FIG. 1.

The write-enable signal $\overline{WE}$ is further supplied to a third pulse generator 6. The generator 6 is comprised of four inverters 611 to 614 and on AND circuit 615, as shown in FIG. 5. The inverter 611 is supplied with the output of the inverter 512, and the output thereof is in turn supplied through the inverters 612 to 614 to one input end of the AND circuit 615 and directly to the other input end thereof. Accordingly, the pulse generator 6 generates a pulse signal $\phi_W$ in response only to the inversion in logic level of the write-enable signal $\overline{WE}$ from the high level to the low level. The pulse width of the pulse signal $\phi_W$ corresponds to the sum of delay times of the inverters 612 to 614.

A chip-enable signal $\overline{CE}$ (see FIG. 1) is produced by an external controller such as a central processing unit (not shown) to select the SRAM 100, and supplied through a chip select terminal 107 to a chip-select circuit 7. The circuit 7 responds to the low level of the chip-enable signal $\overline{CE}$ and produces and activating siganl $\phi_E$ which is supplied to an X-decoder 9, a Y- decoder 11, a memory cell array section 13 and the data-output circuit 15, so that the SRAM 100 is activated to perform the data-write or data-read operation.

Figure 6:
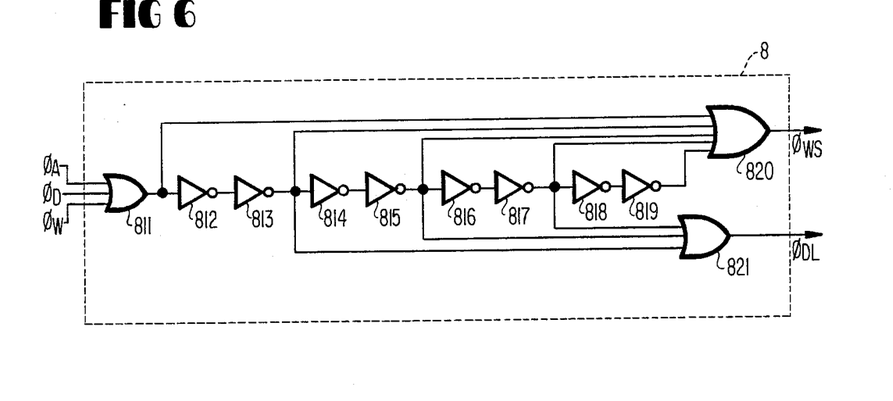
FIG. 6 is a logic circuit diagram of a clock generator shown in FIG. 1.

The pulse signals $\phi_A$, $\phi_D$ and $\phi_W$ generated respectively by the pulse generators 2, 4 and 6 are supplied to a clock generator 8. The generator 8 is comprised of three OR circuits 811, 820 and 821 and eight inverters 812 to 819, as shown in FIG. 6. The OR circuit 811 receives the pulse signals $\phi_A$, $\phi_D$ and $\phi_W$, and the output thereof is supplied to a series circuit comprised of the inverters 812 and 819. The outputs of the OR circuit 811 and the inverters 813, 815, 817 and 819 are supplied to the OR circuit 820, and those of the inverters 813, 815 and 817 are supplied to the OR circuit 821. Therefore, the clock generator 8 responds to any one of the pulse signals $\phi_A$, $\phi_D$ and $\phi_W$ and generates two one-shot clock signals $\phi_{WS}$ and $\phi_{DL}$ from the OR circuits 820 and 821, respectively. The pulse width of the clock signal $\phi_{WS}$ corresponds to the sum of delay times of eight inverters 812 to 819, and that of the clock signal $\phi_{DL}$ corresponds to the sum of those of four inverters 814 to 817. Further, the high level period of the clock signal $\phi_{WS}$ contains that of the clock signal $\phi_{DL}$.

A first group of signals among the output signals produced by the address buffer 1, i.e., the non-inverted address signals $A_{01}$ to $A_{i1}$ and inverted address signals $\overline{A_{01}}$ to $\overline{A_{i1}}$, are supplied to an X-decoder 9 as row address data. The X-decoder 9, when activated by the activating signal $\phi_E$ from the chip-select circuit 7, changes one of word line selecting signals $X_1$ to $X_n$ to a selecting level in response to the row address data. The signals $X_1$-$X_n$ are supplied to an X-buffer 10. The X-buffer 10 is further supplied with the one-shot clock signal $\phi_{WS}$ from the clock generator 8. The X-buffer 10 responds to the selecting level of the one word line selecting signal and changes an associated one of word line energizing signals $X_{11}$-$X_{n1}$ to an energizing level. The period of the energizing level the pulse width is substantially equal to that of the clock signal $\phi_{WS}$.

Figure 7:
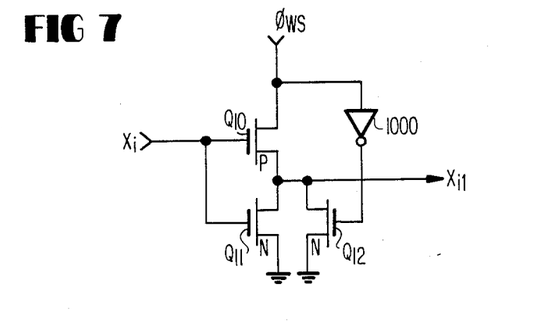
FIG. 7 is a circuit diagram showing a X (row) buffer, in FIG. 1.

FIG. 7 is a circuit diagram showing one part of the X-buffer 10, which is provided for each particular word line selecting signal $X_i$, where $X_i$ is any particular one of the word line selecting signals $X_1$-$X_n$. The signal $X_i$ is supplied in common to the gates of a P-channel MOS transistor $Q_{10}$ and an N-channel MOS transistor $Q_{11}$ which are connected in series. The clock signal $\phi_{WS}$ is supplied to the transistor $Q_{10}$ and further supplied through an inverter 1000 to the gate of an N-channel MOS transistor $Q_{12}$ which is connected in parallel to the transistor $Q_{11}$. The word line energizing signal $X_{i1}$ is produced from the connection point of the transistors $Q_{10}$ and $Q_{11}$. Accordingly, the energizing signal $X_{i1}$ assumes a non-energizing level (i.e., the low level) when the clock signal $\phi_{WS}$ is at the low level or when the selecting signal $X_i$ assumes a non-selecting level (i.e., the high level), and takes the energizing level (i.e., the high level) when the signal $\phi_{WS}$ takes the high level and when the selecting signal $X_i$ takes the selecting level (i.e., the low level).

Other output signals produced from the address buffer 1, i.e. the non-inverted address signals $A_{j1}$ to $A_{l1}$ and the inverted address signals $\overline{A_{j1}}$ to $\overline{A_{l1}}$, are supplied to a Y-decoder 11 as column address data. The Y-decoder 11 responds to the column address data and changes one of bit line selecting signals $Y_1$ to $Y_m$ to the selecting level under the control of the activating signal $\phi_E$ from the chip-select circuit 7. The signals $Y_1$-$Y_m$ are supplied to a Y-buffer 12 which in turn responds to the selecting level of the one bit line selecting signal and changes the associated one of bit line energizing signals $Y_{i1}$-$Y_{m1}$ to the energizing level.

The word line energizing signals $X_{11}$ to $X_{n1}$, the bit line energizing signal $Y_{i1}$ to $Y_{m1}$, the non-inverted and inverted data signals $D_I$ and $\overline{D_I}$, and the internal activating signal $\phi_E$ are supplied to a memory cell array section 13.

Figure 2:
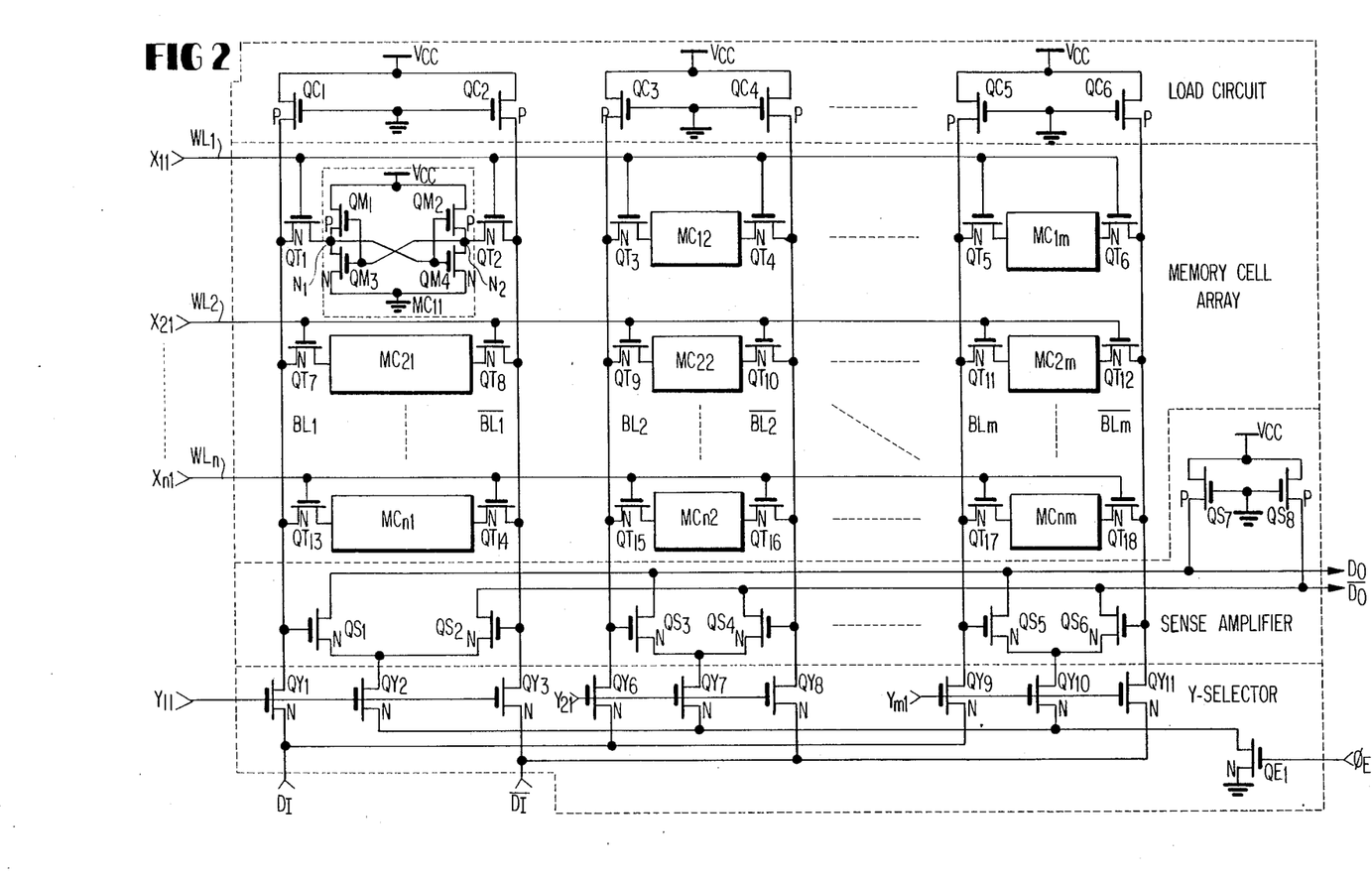
FIG. 2 is a circuit diagram of a memory cell array section shown in FIG. 1.

As shown in FIG. 2, the memory cell array section 13 includes a plurality of memory cells $MC_{11}$ to $MC_{nm}$ arrayed in a matrix form of rows and columns to form a memory cell array. Each memory cell MC has two P-channel MOS transistors $QM_1$ and $QM_2$ and two N-channel MOS transistors $QM_3$ and $QM_4$. The transistors $QM_1$ and $QM_3$ are connected in series between a power voltage $V_{cc}$ supply terminal 101 and a ground potential (GND) supply terminal 102 (see FIG. 1), and a first node $N_1$ of the transistors $QM_1$ and $QM_3$ is connected to the gates of the transistor $QM_2$ and $QM_4$. The transistors $QM_2$ and $QM_4$ are also connected in series between the power supply terminals 101 and 102, and a second node $N_2$ thereof is connected to the gates of the transistors $QM_1$ and $QM_3$. The transistors $QM_1$ and $QM_2$ operate as loads of the transistors $QM_3$ and $QM_4$, respectively. Accordingly, either one of the transistors $QM_3$ and $QM_4$ is turned on in response to the potentials applied to the first and second nodes $N_1$ and $N_2$, and the conductive state of the transistor $QM_3$ or $QM_4$ is maintained.

The first and second nodes $N_1$ and $N_2$ of each memory cell MC are coupled through a pair of transfer gates each comprised of an N-channel MOS transistor QT to a pair of column (bit) lines BL and $\overline{BL}$, respectively. The gates of the transfer gate transistors QT are connected to one of word lines $WL_1$ to $WL_n$ which are supplied with the energizing signals $X_{11}$ to $X_{n1}$ from the X-buffer 10, respectively. The bit lines $BL_1$ to $BL_m$ are coupled through a load circuit to the power supply ($V_{cc}$) terminal 101. The load circuit is comprised of P-channel MOS transistors $QC_1$ to $QC_6$ having gates connected to the ground potential and thus being in a conductive state. Assuming that the first word line $WL_1$ is energized by the energizing signal $X_{11}$, the transfer gate transistors $QT_1$ to $QT_6$ are turned ON to electrically connect the nodes $N_1$ and $N_2$ of the memory cells $MC_{11}$ to $MC_{1m}$ to the bit lines $BL_1$ to $BL_m$, respectively. One of a pair of bit lines BL and $\overline{BL}$ is thereby decreased in potential in response to the conductive state of the transistor $QM_3$ or $QM_4$ in each accessed memory cell MC, because a d.c. current flows into the transistor $QM_3$ or $QM_4$ through the load transistor QC and the bit line BL or $\overline{BL}$ from the power supply $V_{cc}$. This d.c. current is maintained to flow so long as the word line $WL_1$ is energized. In the SRAM 100 according to the present invention, however, the energizing signal $X_{11}$ assumes the energizing level only during a period of time corresponding to the pulse width of the one-shot clock signal $\phi_{WS}$, and therefore the period during which the d.c. current flows is suppressed to reduce the power dissipation.

The bit line energizing signals $Y_{l1}$ to $Y_{m1}$ are supplied to a Y-selector circuit in the memory cell array section 13. The Y-selector circuit is comprised of N-channel MOS transistors $QY_1$ to $QY_{11}$ and thus couples a pair of bit lines BL and $\overline{BL}$ to the data buffer 3 in response to one of the energizing signals $Y_{11}$ to $Y_{m1}$. In the data-write operation, the first and second nodes $N_1$ and $N_2$ of the memory cell MC which is disposed at the intersection of the selected and energized word and bit lines WL and BL, are subjected to the change in potential due to the data signals $D_I$ and $\overline{D_I}$ produced by the data buffer 3 in response to the data to be stored, so that either the transistor $QM_3$ or $QM_4$ is forcedly turned ON. On the other hand, in the data-read operation, both the signals $D_I$ and $\overline{D_I}$ take the high level as apparent from FIG. 4 showing the logic circuit of the data buffer 3, and therefore a pair of bit lines BL and $\overline{BL}$ are subjected to the change in potential in response to the conductive state of the transistor $QM_3$ or $QM_4$ of the selected memory cell MC.

The Y-selector circuit also activates a sense amplifier in the memory cell array section 13. The sense amplifier is comprised of N-channel MOS transistors $QS_1$ to $QS_8$, and each of two transistors $QS_1$ and $QS_2$, $QS_3$ and $QS_4$, ..., $QS_5$ and $QS_6$ forms a differential amplifier. The transistors $QS_7$ and $QS_8$ are common loads of the respective differential amplifiers. There is also provided an N-channel MOS transistor $QE_1$ supplied with the activating signal $\phi_E$ from the chip-select circuit 7, so that the sense amplifier is activated by the signal $\phi_E$. Each differential amplifier in the sense amplifier amplifies the difference in potentials between the selected bit lines BL and $\overline{BL}$, and the amplified outputs $D_0$ and $\overline{D_0}$ are supplied to a data latch circuit 14.

Figure 8:
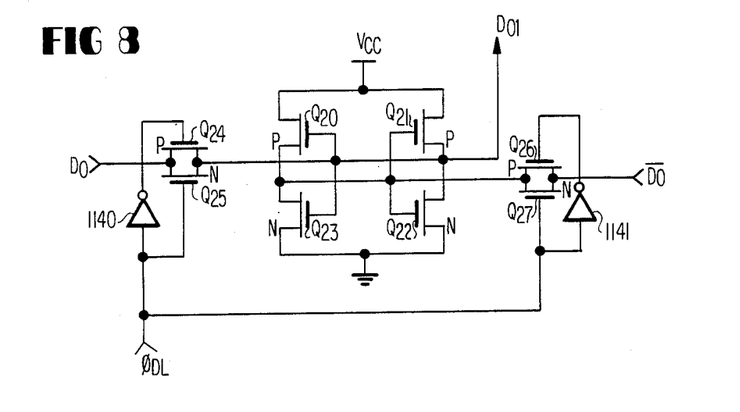
FIG. 8 is a circuit diagram of a latch circuit shown in FIG. 1.

The data latch circuit 14 includes four P-channel MOS transistors $Q_{20}$, $Q_{21}$, $Q_{24}$ and $Q_{26}$, four N-channel MOS transistors $Q_{22}$, $Q_{23}$, $Q_{25}$ and $Q_{27}$, and two inverters 1140 and 1141 (See FIG. 8.). The transistors $Q_{20}$ to $Q_{23}$ constitute a flip-flop circuit, and the amplified outputs $D_0$ and $\overline{D_0}$ from the sense amplifier are supplied to the flip-flop circuit through transmission gates comprised of the transistors $Q_{24}$ and $Q_{25}$ and $Q_{26}$ and $Q_{27}$. The transmission gates are controlled by the one-shot clock signal $\phi_{DL}$ from the clock generator 4, and brought into an open state only when the signal $\phi_{DL}$ takes the high level. The output $D_{01}$ of the latch circuit 14 is supplied to the data output circuit 15.

The data output circuit 15 is further supplied with the internal control signals $WE_2$ and $\phi_E$. In the data-write operation, the signal $WE_2$ takes the high level, so that the output circuit 15 is inactivated. In the data-read operation, the signal $WE_2$ is inverted into the low level to activate the output circuit 15. An output data signal $D_{OUT}$ is thereby produced from a data output terminal 108.

As described above, the selected word line WL is energized by the one-shot clock signal $\phi_{WS}$, and therefore the power current flowing into the accessed memory cells is suppressed during each cycle period of the data-write and data-read operations. The power dissipation is thereby reduced in the SRAM 100 according to the present invention.

Figure 9:
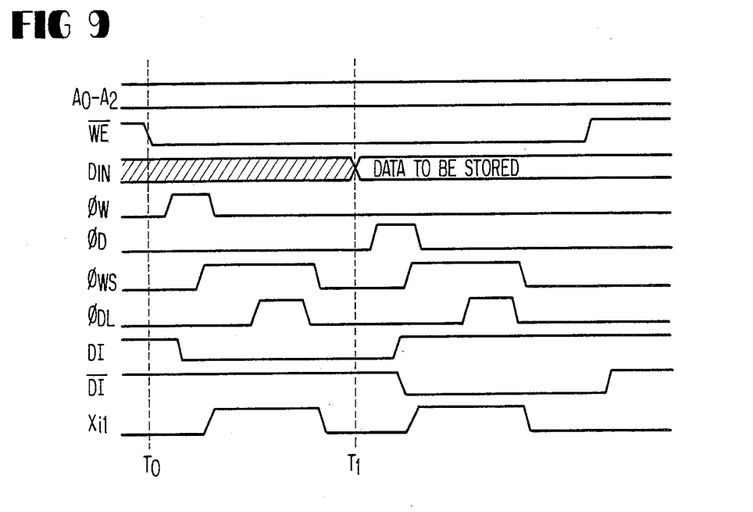
FIGS. 9 and 10 are timing charts for explaining a circuit operation of the SRAM shown in FIG. 1.

Moreover, the clock generator 8 generates the one-shot signals $\phi_{WS}$ and $\phi_{DL}$ in response also to the change in logic level of the data input signal $D_{IN}$. Accordingly, the input data is stored into the accessed memory cell MC without error, even if the data to be stored is supplied to the SRAM 100 after the passage of a relatively long time from a time point at which the write-enable signal $\overline{WE}$ changes from the high level to the low level. More specifically, as the timing charts in that case are shown in FIG. 9, when the write-enable signal $\overline{WE}$ changes at a timing point To from the high level to the low level to bring the SRAM 100 into the data-write operation, the second pulse generator 4 generates the pulse signal $\phi_W$. The clock generator 8 responds to the pulse signal $\phi_W$ and generates the one-shot pulse signals $\phi_{WS}$ and $\phi_{DL}$. The word line $WL_i$ selected in accordance with the address signals $A_0$ to $A_l$ is energized by the word line energizing signal $X_{i1}$ which is produced by the X-buffer 10 in response to the one-shot signal $\phi_{WS}$, so that the input data $D_{IN}$ is stored in the memory cell which is disposed at the intersection of the energized word line $WL_i$ and bit line $BL_i$. However, it should be noted that the data supplied to the data input terminal 105 is different from the data to be stored. The data to be stored is supplied to the terminal 105 at a point of time $T_1$ when the one-shot clock signal $\phi_{WS}$ has already disappeared, as shown in FIG. 9. Such a condition frequently occurs in SRAMs. In the SRAM 100 according to the present invention, however, the third pulse generator 6 generates the pulse signal $\phi_D$ in response to the change in logic level of the input data $D_{IN}$. The clock generator 8 thereby generates the one-shot signal $\phi_{WS}$ again, and the selected word line $WL_i$ is energized again as shown in FIG. 9. As a result, the true data is stored in the accessed memory cell. If the data to be stored does not change its logic level, the further generation of the one-shot signal $\phi_{WS}$ does not occur. However, this means that the data to be stored is equal to the data which has been stored in response to the change of the write-enable signal $\overline{WE}$ from the high level to the low level.

Figure 10:
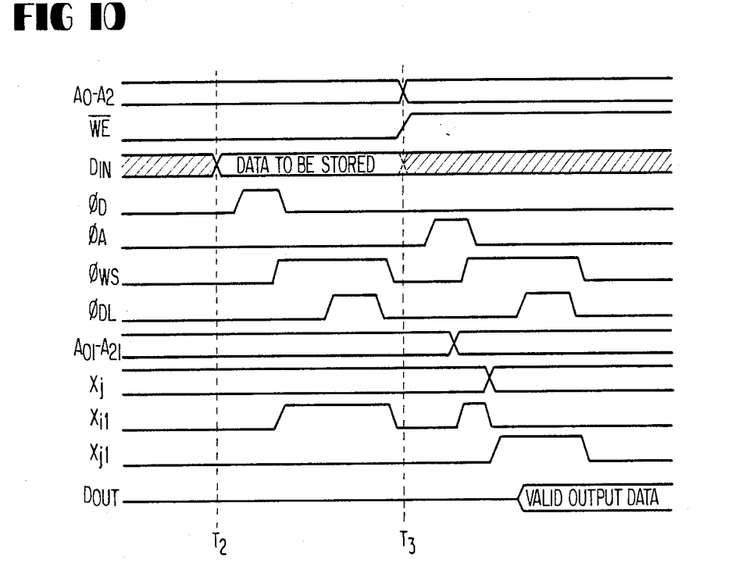

In addition, the clock generator 8 does not generate the one-shot signal $\phi_{WS}$ when the write-enable signal $\overline{WE}$ changes from low level to the high level to bring the SRAM 100 into the data-read operation. Accordingly, the SRAM 100 is not subjected to erroneous operation, even when the address signals change simultaneously with or just after the change of the write-enable signal $\overline{WE}$ from the low level to the high level. More specifically, as the timing charts in that case are shown in FIG. 10, when the data to be stored is supplied at a timing point $T_2$ to the terminal 105 while the write-enable signal $\overline{WE}$ is in the low level, the data-write operation responsive to the change of the data signal is carried out as described hereinbefore, and this operation ends before a point $T_3$ of time when the write-enable signal $\overline{WE}$ changes from the low level to the high level. When the address signals $A_0$ to $A_l$ change at the timing point $T_3$, the first pulse generator 2 generates the pulse signal $\phi_A$, and the clock generator responds to the pulse signal $\phi_A$ and generates the one-shot signals $\phi_{WS}$ and $\phi_{DL}$. On the other hand, the X-decoder 9 responds to the new address signals and changes a new word line selecting signal $X_j$ to the selecting level, but the change of the new selecting signal $X_j$ to the selecting level is carried out after the one-shot signal $\phi_{WS}$ is generated. For this reason, the previous word line energizing signal $X_{i1}$ is again changed to the energizing level to energize the word line $WL_i$. However, the X-decoder 9 changes the new selecting signal $X_j$ to the selecting level before the one-shot pulse signal $\phi_{DL}$ is generated, and therefore the previous energizing signal $X_{i1}$ changes to the non-selecting level and a new energizing signal $X_{j1}$ is changed to the energizing level. As a result, a new word line $X_j$ is energized, and the data stored in the memory cell which is selected by the new word line $WL_j$ and new bit line $BL_j$, is read out and then latched by the data latch circuit 14 in response to the one-shot signal $\phi_{DL}$. The valid output data $D_{OUT}$ is thus obtained from the terminal 108.

The present invention is not limited to the above-mentioned embodiments, but may be modified and changed without departing from the scope and spirit of the present invention. For example, only N-channel or P-channel MOS transistors can be employed to constitute the respective circuit blocks in the SRAM 100. The transistor $QE_1$ (see FIG. 2) may be supplied with the one-shot signal $\phi_{WS}$ in place of the internal signal $\phi_E$, and in that case the power dissipation in the sense amplifier is reduced.

What is claimed is:

1. A semiconductor memory device comprising a plurality of memory cells disposed at intersections of word lines and bit lines, means responsive to address signals for selecting at least one word line, means for receiving an input data signal, means coupled to said receiving means for generating a one-shot signal ($\phi_D$) when said input data signal changes its logic level, means for detecting when said memory device is in a data-write operation, means (417) coupled to said generating means and to said detecting means for inhibiting generation of said one-shot signal from said generating means at times other than when said detecting means detects that said memory device is in a data-write operation, means responsive to said one-shot signal for energizing the selected word line, and means for writing said input data signal into the memory cell which is accessed by the energized word line.

2. The memory device as claimed in claim 1, further comprising means responsive to a change in logic level of any one of said address signals for producing a pulse signal, and means for generating a one-shot signal in response to said pulse signal.

3. The memory device as claimed in claim 2, further comprising means for outputting an output data signal corresponding to the data stored in the memory cell which is accessed by the energized word line.

4. A semiconductor memory device comprising a plurality of memory cells arrayed in a matrix form, means responsive to a set of address signals for selecting at least one memory cell, means for receiving a write-enable signal which assumes a first level when said memory device is to enter into a data-write operation or a second level when said memory device is to enter into a data-read operation, a data input circuit supplied with an input data signal, means coupled to said receiving means for generating a first pulse signal when said write-enable signal changes from said second level to said first level, means coupled to said receiving means and said data input circuit for generating a second pulse signal in response to a change in said input data signal while said write-enable signal assumes said first level, and means responsive to any one of said first and second pulse signals for storing data corresponding to said input data signal into said at least one memory cell.

5. The memory device as claimed in claim 4, wherein said storing means includes a clock generator for generating a one-shot clock signal and supplying said data to said at least one memory cell during a period corresponding to a period during which said one-shot clock signal is generated.

6. The memory device as claimed in claim 4, further comprising means for producing a third pulse signal in response to a change in logic level of any one of said address signals, said storing means being further responsive to said third pulse signal for storing said data into at least one memory cell when said write-enable signal assumes said first level.

7. The memory device as claimed in claim 6, further comprising a data output circuit for producing an output data signal corresponding to the data stored in said at least one memory cell while said write-enable signal assumes said second level.

8. A semiconductor memory device comprising a plurality of memory cells arrayed in a matrix form, means responsive to a set of address signals for selecting at least one memory cell, means for producing a pulse signal in response to a change in logic level of any one of said address signals, means for receiving a write-enable signal which assumes a first level when said memory device is to enter into a data-write operation or a second level when said memory device is to enter into a data-read operation, a data input circuit supplied with an input data signal, means for generating a first one-shot signal when said write-enable signal changes from said first level to said second level, a second one-shot signal when said input data signal changes its logic level and a third one-shot signal in response to said pulse signal, said generating means being coupled to said receiving means, said data input circuit and said producing means, means responsive to any one of said first, second and third one-shot signals for coupling said at least one memory cell to said data input circuit during a period of time corresponding to the time duration of the generated one-shot signal, means for storing data corresponding to said input data signal into said at least one memory cell, said generating means further generating a fourth one-shot signal, a data latch circuit, said data latch circuit being activated by said fourth one-shot signal to latch said data stored in said at least one memory cell, and a data output circuit responsive to said second level of said write-enable signal for producing an output data signal corresponding to the data latched in said data latch circuit.

9. The memory device as claimed in claim 8, wherein said fourth one-shot signal is generated at the same time as said second or third one-shot signal is generated and the time duration of said fourth signal is less than that of said second or third one-shot signal.

10. A semiconductor memory device comprising an address buffer supplied with address signals, a first pulse generator responding to a change in logic level of any one of said address signals and generating a first pulse signal, a write-control circuit supplied with a write-enable signal for producing a first control signal in response to a first state of said write-enable signal and a second control signal in response to a second state of said write-enable signal, a second pulse generator responsive to a change of said write-enable signal from said second state to said first state for generating a second pulse signal, a data buffer supplied with an input data signal for producing an internal data signal in response to said first control signal, a third pulse generator responsive to a change in logic level of said internal data signal for generating a third pulse signal, a clock generator responsive to any one of said first, second and third pulse signals for generating a first one-shot signal, a row decoder responsive to a first group of outputs of said address buffer for producing a first selecting signal, a column decoder responsive to a second group of outputs of said address buffer for producing a second selecting signal, a plurality of row lines, a plurality of column lines, a plurality of memory cells disposed at the intersections of said row and column lines, a row buffer responsive to said first one-shot signal and said first selecting signal for energizing one of said row lines during a period of time corresponding to a signal width of said first one-shot signal, a column buffer responsive to said second selecting signal for energizing one of said column lines, and means responsive to said first state of said write-enable signal for storing said internal data signal into at least one memory cell which is accessed by the energized row and column lines;

11. A semiconductor memory device comprising an address buffer, means for supplying address signals to said address buffer, a first pulse generator for generating a first pulse signal in response to a change in logic level of any one of said address signals, a write-control circuit, which receives a write-enable signal, for producing a first control signal in response to a first state of said write-enable signal and a second control signal in response to a second state of said write-enable signal, a second pulse generator for generating a second pulse signal in response to a change of said write-enable signal from said second state to said first state, a data buffer supplied with an input data signal and producing an internal data signal in response to said first control signal, a third pulse generator responsive to a change in logic level of said internal data signal for generating a third pulse signal, a clock generator responsive to any one of said first, second and third pulse signals for generating a first one-shot signal, a row decoder responsive to a first group of outputs of said address buffer for producing a first selecting signal, a column decoder responsive to a second group of outputs of said address buffer producing a second selecting signal, a plurality of row lines, a plurality of column lines, a plurality of memory cells associated with respective ones of said row and column lines, a row buffer responsive to said first one-shot signal and to said first selecting signal for energizing one of said row liens during a period of time corresponding to a signal width of said first one-shot signal, a column buffer responsive to said second selecting signal for energizing one of said column lines, means responsive to said first state of said write-enable signal for storing said internal data signal into at least one memory cell which is accessed by the energized row and column lines, and clock generator further generating a second one-shot signal along with said first one-shot signal, a latch circuit responsive to said second one-shot signal for latching data stored in the memory cell which is accessed by the energized row and column lines, and a data output circuit responsive to said second control signal for producing an output data signal corresponding to the data latched in said latch circuit.

* * * * *

UNITED STATES PATENT AND TRADEMARK OFFICE
CERTIFICATE OF CORRECTION

PATENT NO. : 4,707,809
DATED : November 17, 1987
INVENTOR(S) : Manabu Ando

It is certified that error appears in the above-identified patent and that said Letters Patent is hereby corrected as shown below:

Abstract, line 10, delete "sorted" and insert --stored--.
Column  3, line 66, delete "$WE_1$" and insert --$\overline{WE}_1$--.

Column  6, line 47, delete "and BL" and insert --and $\overline{BL}$--;
          line 61, delete "Y11" and insert --$Y_{11}$--.
Column 12, line  9, delete "liens" and insert --lines--.

Signed and Sealed this

Fourth Day of October, 1988

Attest:

DONALD J. QUIGG

*Attesting Officer*   *Commissioner of Patents and Trademarks*